(12) United States Patent
Park et al.

(10) Patent No.: US 11,264,481 B2
(45) Date of Patent: Mar. 1, 2022

(54) SELF-ALIGNED SOURCE AND DRAIN CONTACTS

(71) Applicant: International Business Machines Corporation, Armonk, NY (US)

(72) Inventors: Chanro Park, Clifton Park, NY (US); Kangguo Cheng, Schenectady, NY (US); Ruilong Xie, Niskayuna, NY (US); Juntao Li, Cohoes, NY (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 16/918,755

(22) Filed: Jul. 1, 2020

(65) Prior Publication Data

US 2022/0005934 A1   Jan. 6, 2022

(51) Int. Cl.
| | |
|---|---|
| *H01L 29/66* | (2006.01) |
| *H01L 21/285* | (2006.01) |
| *H01L 21/768* | (2006.01) |
| *H01L 23/532* | (2006.01) |
| *H01L 23/535* | (2006.01) |

(Continued)

(52) U.S. Cl.
CPC ...... *H01L 29/665* (2013.01); *H01L 21/28518* (2013.01); *H01L 21/7682* (2013.01); *H01L 21/76805* (2013.01); *H01L 21/76895* (2013.01); *H01L 23/535* (2013.01); *H01L 23/5329* (2013.01); *H01L 29/45* (2013.01); *H01L 29/66795* (2013.01); *H01L 29/7851* (2013.01)

(58) Field of Classification Search
CPC ........... H01L 21/28518; H01L 21/7682; H01L 21/76895; H01L 21/76805; H01L 23/535; H01L 23/5329; H01L 29/665; H01L 29/66795; H01L 29/45; H01L 29/7851

See application file for complete search history.

(56) References Cited

U.S. PATENT DOCUMENTS

| | | | |
|---|---|---|---|
| 6,015,752 A * | 1/2000 | Xiang | H01L 29/41783 |
| | | | 257/E21.438 |
| 6,855,610 B2 | 2/2005 | Tung et al. | |
| 6,987,050 B2 | 1/2006 | Cabral, Jr. et al. | |

(Continued)

FOREIGN PATENT DOCUMENTS

| | | |
|---|---|---|
| WO | WO2011090571 A2 | 7/2011 |
| WO | WO2011090571 A3 * | 7/2011 |

OTHER PUBLICATIONS

Kim et al., "Effects of cobalt silicidation and postannealing on void defects at the sidewall apcer edge of metal-oxide-silicon field-effect transistors," Applied Physics Letters, vol. 75, No. 9, pp. 1270-1272 (Aug. 1999).

*Primary Examiner* — Herve-Louis Y Assouman
(74) *Attorney, Agent, or Firm* — Randall Bluestone; Michael J. Chang, LLC

(57) ABSTRACT

Self-aligned semiconductor FET device source and drain contacts and techniques for formation thereof are provided. In one aspect, a semiconductor FET device includes: at least one gate disposed on a substrate; source and drains on opposite sides of the at least one gate; gate spacers offsetting the at least one gate from the source and drains; lower source and drain contacts disposed on the source and drains; upper source and drain contacts disposed on the lower source and drain contacts; and a silicide present between the lower source and drain contacts and the upper source and drain contacts.

20 Claims, 12 Drawing Sheets

(51) Int. Cl.
    *H01L 29/45*     (2006.01)
    *H01L 29/78*     (2006.01)

(56) References Cited

U.S. PATENT DOCUMENTS

| | | |
|---|---|---|
| 8,076,230 B2 | 12/2011 | Wei |
| 9,722,043 B2 | 8/2017 | Basker et al. |
| 10,141,226 B2 | 11/2018 | Bohr et al. |
| 10,236,350 B2 | 3/2019 | Bouche et al. |
| 2009/0121287 A1* | 5/2009 | Bernstein ................ H01L 21/84 257/347 |
| 2009/0294871 A1* | 12/2009 | Besser ................ H01L 29/6659 257/384 |
| 2016/0260712 A1* | 9/2016 | Yagishita ............... H01L 27/088 |
| 2017/0222008 A1* | 8/2017 | Hsu ................... H01L 21/76889 |
| 2019/0259619 A1 | 8/2019 | Zang et al. |
| 2019/0334009 A1* | 10/2019 | Cheng ............... H01L 29/66795 |

* cited by examiner

SELF-ALIGNED SOURCE AND DRAIN CONTACTS

FIELD OF THE INVENTION

The present invention relates to semiconductor field-effect transistor (FET) device contact structures, and more particularly, to self-aligned semiconductor FET device source and drain contacts and techniques for formation thereof.

BACKGROUND OF THE INVENTION

In the semiconductor device industry, there is a movement towards non-self-align contact (SAC) in middle-of-line (MOL) fabrication. Non-SAC processes are easier to implement, are lower cost, and do not require the complex fabrication modules needed for an SAC process.

However, while a non-SAC process is easier to implement than an SAC process, device scaling presents some notable challenges. Namely, as device dimensions are further scaled it will become increasingly more difficult to implement a non-SAC process without contact resistance tradeoffs.

Thus, improved contact designs and techniques for fabrication thereof would be desirable.

SUMMARY OF THE INVENTION

The present invention provides self-aligned semiconductor field-effect transistor (FET) device source and drain contacts and techniques for formation thereof. In one aspect of the invention, a semiconductor field-effect transistor (FET) device is provided. The semiconductor FET device includes: at least one gate disposed on a substrate; source and drains on opposite sides of the at least one gate; gate spacers offsetting the at least one gate from the source and drains; lower source and drain contacts disposed on the source and drains; upper source and drain contacts disposed on the lower source and drain contacts; and a silicide present between the lower source and drain contacts and the upper source and drain contacts.

In another aspect of the invention, a method of forming a semiconductor FET device is provided. The method includes: forming a device structure including at least one gate, source and drains on opposite sides of the at least one gate, and gate spacers offsetting the at least one gate from the source and drains; forming lower source and drain contacts on the source and drains; depositing a silicon (Si) layer over the gates, the gate spacers, and the lower source and drain contacts; annealing the device structure under conditions sufficient to form a silicide directly on the lower source and drain contacts; and forming upper source and drain contacts in direct contact with the silicide.

In yet another aspect of the invention, another method of forming a semiconductor FET device is provided. The method includes: forming a device structure including at least one gate, source and drains on opposite sides of the at least one gate, and gate spacers offsetting the at least one gate from the source and drains; forming lower source and drain contacts on the source and drains; depositing a silicon (Si) layer over the gates, the gate spacers, and the lower source and drain contacts; annealing the device structure under conditions sufficient to form a silicide directly on the lower source and drain contacts; depositing an ILD on the Si layer over the silicide; patterning upper contact trenches in the ILD over the silicide; forming sacrificial upper source and drain contacts in the upper contact trenches; removing the ILD and the Si layer; depositing an ILD stack including a first ILD layer and a second ILD layer surrounding the sacrificial upper source and drain contacts; removing the sacrificial upper source and drain contacts and the silicide to form cavities over the lower source and drain contacts; and forming upper source and drain contacts in the cavities.

A more complete understanding of the present invention, as well as further features and advantages of the present invention, will be obtained by reference to the following detailed description and drawings.

DETAILED DESCRIPTION OF PREFERRED EMBODIMENTS

Provided herein are fully aligned, self-aligned contacts (SAC) and techniques for formation thereof that employ a non-SAC patterning approach. Thus, the present techniques advantageously leverage the advantages of a non-SAC approach (i.e., lower cost, less complexity, easier to implement, etc.) while producing a self-aligned contact.

As will be described in detail below, the present techniques involve selectively forming a silicide between the upper and lower source and drain contacts to produce the SAC design. In one exemplary embodiment, a silicon (Si) layer is deposited onto the lower source and drain contact, and then annealed to react the Si with the metal in the lower source and drain contact to form the silicide. See FIGS. 1-12. In another exemplary embodiment, the lower source and drain contacts are recessed prior to depositing the Si layer so as to confine the silicide over the lower source and drain contacts. See FIGS. 13-17. In yet another exemplary embodiment, a low resistance silicide is first formed on the lower source and drain contact. See FIG. 18. In still yet another exemplary embodiment, a sacrificial upper source and drain contact is used during silicide formation, which is then removed along with the silicide and replaced with an upper source and drain contact that is in direct contact with the lower source and drain contact. See FIG. 19.

A first exemplary methodology for forming a semiconductor field-effect transistor (FET) device in accordance with the present techniques is now described by way of reference to FIGS. 1-12. As will become apparent from the description that follows, this process will be implemented to form a semiconductor FET device having gates and source and drains, interconnected by a fin channel, on opposite sides of the gates. Upper and lower source and drain contacts, with a silicide in between the upper and lower source and drain contacts, will be formed over the source and drains. A silicide in between the upper and lower source and drain contacts will provide SAC alignment without the need for an SAC patterning approach.

Figure 1:
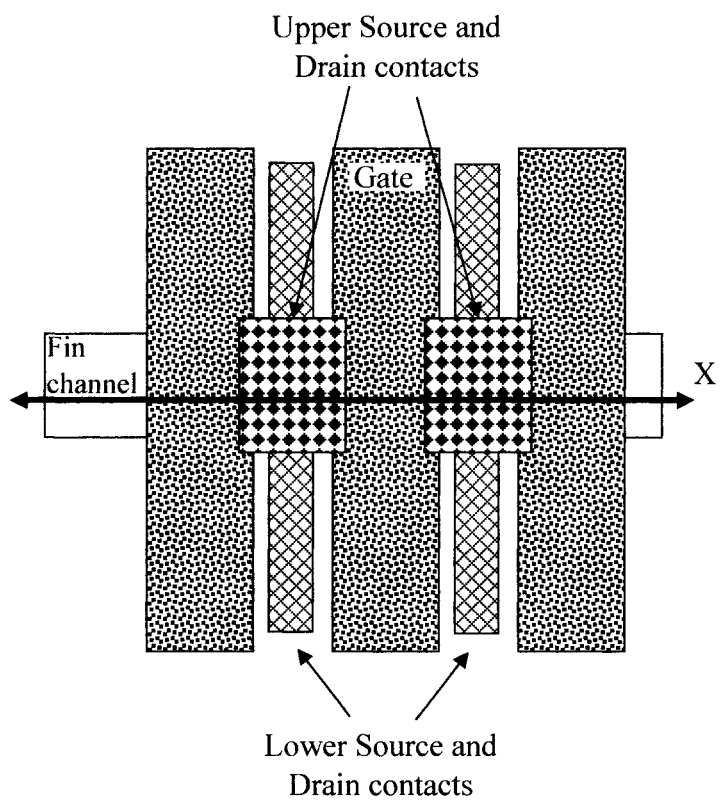
FIG. 1 is a top-down view of the general semiconductor field-effect transistor (FET) device presented herein having a fin channel(s), gates oriented orthogonal to the fin channel(s), lower source and drain contacts parallel to the gates, and upper source and drain contacts disposed over the lower source and drain contacts according to an embodiment of the present invention.

In each of the following figures, a cross-sectional view through a part of the semiconductor FET device will be depicted. See, for example, FIG. 1 which shows a top-down view of the general semiconductor FET device design illustrating the orientations of the cuts through the device that will be depicted in the figures. Referring to FIG. 1, in one exemplary embodiment, the present semiconductor FET device design includes a fin channel oriented orthogonal to the gates of the semiconductor FET device. The lower source and drain contacts run parallel to the gates. The upper source and drain contacts are disposed over the lower source and drain contacts. It is notable that, there might be devices structures such as an interlayer dielectric (ILD) disposed over the gates, gate spacers, etc. (see below) which are not shown in FIG. 1. This is done merely for ease and clarity of depicting the orientation of the cross-sectional views. Namely, as shown in FIG. 1, a cross-section X will provide views of cuts through the fin channel, perpendicular to the gates and upper/lower source and drain contacts.

Figure 2:
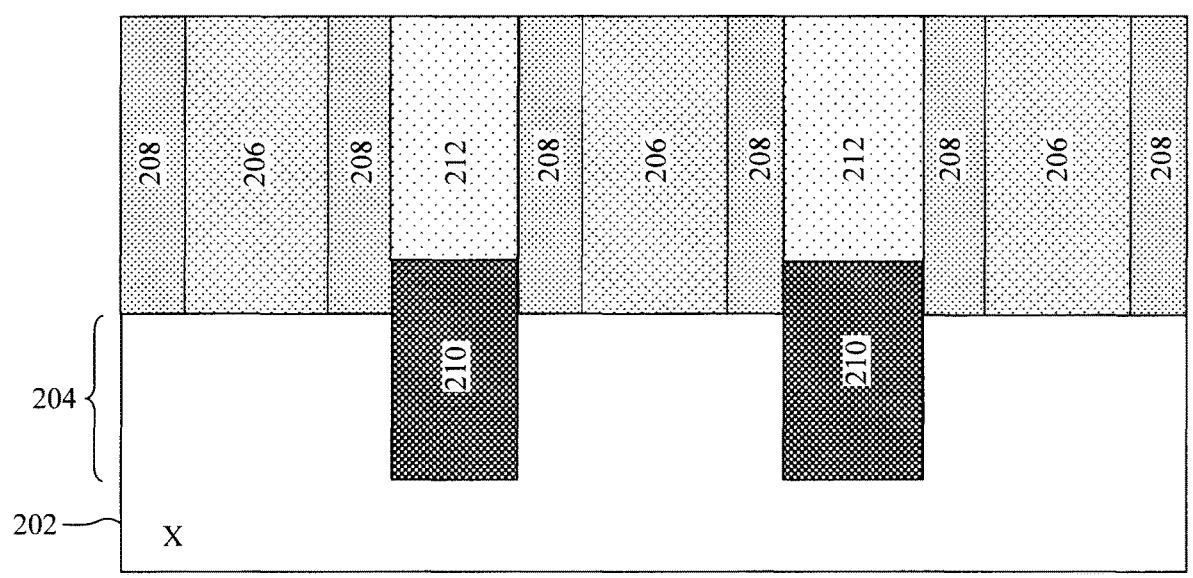
FIG. 2 is a cross-sectional diagram illustrating at least one fin having been patterned in a substrate, sacrificial gates having been formed on the fin(s), gate spacers having been formed on opposite sides of the sacrificial gates, source and drains having been formed in the fin(s) on opposite sides of the sacrificial gates offset by the gate spacers, and the sacrificial gates and gate spacers having been buried in a (first) interlayer dielectric (ILD) according to an embodiment of the present invention.
Figure 3:
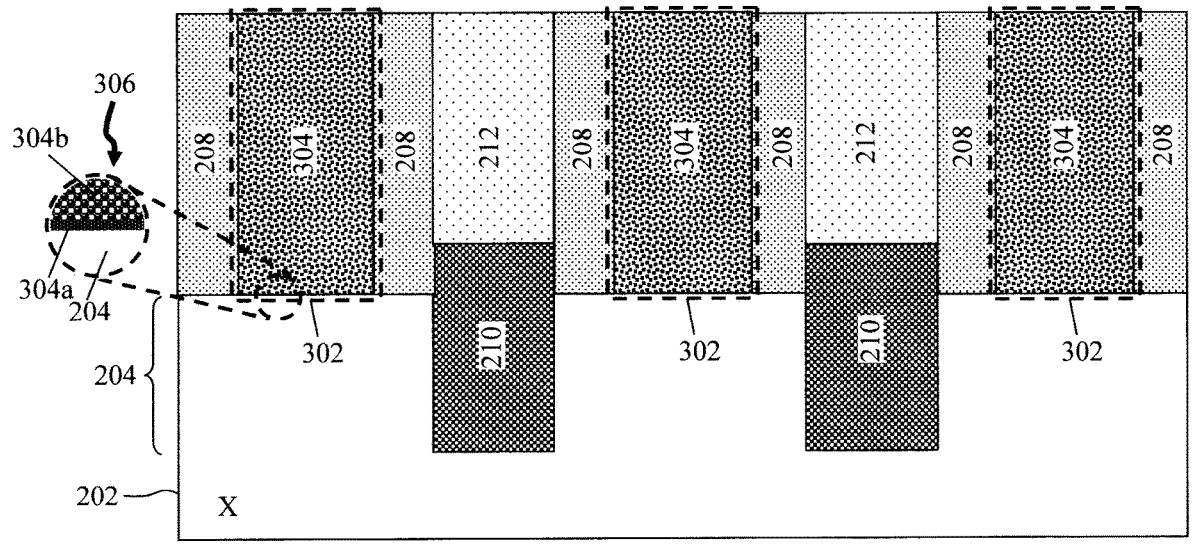
FIG. 3 is a cross-sectional diagram illustrating the sacrificial gates having been selectively removed forming gate trenches in between the gate spacers, and replacement gates having been formed in the gate trenches according to an embodiment of the present invention.

As shown in FIG. 2 (a cross-sectional view X), the process begins with the patterning of at least one fin 204 in a substrate 202. According to an exemplary embodiment, substrate 202 is a bulk semiconductor wafer, such as a bulk silicon (Si), bulk germanium (Ge), bulk silicon germanium (SiGe) and/or bulk III-V semiconductor wafer. Alternatively, substrate 202 can be a semiconductor-on-insulator (SOI) wafer. A SOI wafer includes a SOI layer separated from an underlying substrate by a buried insulator. When the buried insulator is an oxide it is referred to herein as a buried oxide or BOX. The SOI layer can include any suitable semiconductor, such as Si, Ge, SiGe, and/or a III-V semiconductor. Substrate 202 may already have pre-built structures (not shown) such as transistors, diodes, capacitors, resistors, interconnects, wiring, etc.

Standard lithography and etching techniques can be used to pattern fin(s) 204 in substrate 202. With standard lithography and etching processes, a lithographic stack (not shown), e.g., photoresist/organic planarizing layer (OPL)/anti-reflective coating (ARC), is used to pattern a hardmask (not shown) with the footprint and location of the fin(s) 204. Alternatively, the hardmask can be formed by other suitable techniques, including but not limited to, sidewall image transfer (SIT), self-aligned double patterning (SADP), self-aligned quadruple patterning (SAQP), and other self-aligned multiple patterning (SAMP). An etch is then used to transfer the pattern of the fin(s) 204 from the hardmask to the underlying substrate 202. The hardmask is then removed. A directional (anisotropic) etching process such as reactive ion etching (RIE) can be employed for the fin etch.

According to an exemplary embodiment, the present techniques are implemented in conjunction with a gate-last process. With a gate-last process, sacrificial gates are formed over the channel region of the semiconductor FET device early on in the process. The sacrificial gates are then used to place the source and drains on opposite sides of the channel region. The sacrificial gates are then removed and replaced with a final, i.e., replacement, gate stack of the device. When the replacement gate stack is a metal gate, it is also referred to herein as a replacement metal gate or RMG. A notable advantage of the gate-last process is that it prevents the final gate components from being exposed to potentially damaging conditions, such as elevated temperatures, experienced during fabrication. Of particular concern are high-κ gate dielectrics which can be damaged by exposure to elevated temperatures such as those experienced during source/drain formation.

To begin the gate-last process, sacrificial gates 206 are formed on the fin(s) 204. According to an exemplary embodiment, sacrificial gates are formed by first depositing a suitable sacrificial material onto substrate 202 over fin(s) 204, and then patterning the sacrificial material (using a directional (anisotropic) etching process such as RIE) into the individual sacrificial gates 206 shown in FIG. 2. Suitable sacrificial gate materials include, but are not limited to, poly-silicon (poly-Si) and/or amorphous silicon (a-Si). A process such as chemical vapor deposition (CVD), atomic layer deposition (ALD) or physical vapor deposition (PVD) can be employed to deposit the sacrificial material. According to an exemplary embodiment, a thin (e.g., from about 1 nanometer (nm) to about 3 nm) layer of silicon oxide (SiOx) is first formed on the fin(s) 204.

Gate spacers 208 are then formed on opposite sides of the sacrificial gates 206. According to an exemplary embodiment, gate spacers 208 are formed by first depositing a suitable spacer material over the sacrificial gates 206 and then using anisotropic etching techniques such as RIE to etch the spacer material as shown in FIG. 2 such that the final spacer 208 is present along the opposite sidewalls of the sacrificial gates 206. Suitable spacer materials include, but are not limited to, oxide spacer materials such as silicon oxide (SiOx) and/or silicon oxycarbide (SiOC) and/or nitride spacer materials such as silicon nitride (SiN), silicon borocarbonitride (SiBCN) and/or silicon oxycarbonitride (SiOCN). A process such as CVD, ALD or PVD can be employed to deposit the spacer material.

Source and drains 210 are then formed in the fin(s) 204 on opposite sides of the sacrificial gates 206, offset from the sacrificial gate 206 by the gate spacers 208. According to an exemplary embodiment, source and drains 210 are formed from an in-situ doped (i.e., where a dopant(s) is introduced during growth) or ex-situ doped (e.g., where a dopant(s) is introduced by ion implantation) epitaxial material such as epitaxial Si, epitaxial SiGe, etc. Suitable n-type dopants include, but are not limited to, phosphorous (P) and/or arsenic (As). Suitable p-type dopants include, but are not limited to, boron (B).

The sacrificial gates 206 and gate spacers 208 are then buried in an interlayer dielectric (ILD) 212 that is deposited over source/drains 210, followed by planarization using a process such as chemical-mechanical polishing (CMP). A process such as CVD, ALD or PVD can be employed to deposit the ILD 212. Suitable ILD 212 materials include, but are not limited to, nitride materials such as silicon nitride (SiN) and/or oxide materials such as SiOx and/or organosilicate glass (SiCOH) and/or ultralow-κ interlayer dielectric (ULK-ILD) materials, e.g., having a dielectric constant κ of less than 2.7. By comparison, silicon dioxide (SiO$_2$) has a dielectric constant κ value of 3.9. Suitable ultralow-κ dielectric materials include, but are not limited to, porous organosilicate glass (pSiCOH).

The placement of ILD 212 enables the sacrificial gates 206 to then be selectively removed forming gate trenches (illustrated using dashed lines 302) in between the gate spacers 208. Replacement gates 304 are then formed in the gate trenches. See FIG. 3 (a cross-sectional view X). According to an exemplary embodiment, sacrificial gates 206 are removed using a (poly-Si and/or amorphous-Si) selective directional (anisotropic) etching process such as RIE or wet process.

According to an exemplary embodiment, the replacement gates 304 are 'replacement metal gates' or RMGs, each including a gate dielectric 304a and at least one workfunction-setting metal 304b disposed on the gate dielectric 304a. See magnified view 306 in FIG. 3. Although not explicitly shown in FIG. 3, a thin (e.g., from about 0.3 nm to about 5 nm, and ranges therebetween, e.g., about 1 nm) interfacial oxide (e.g., silicon oxide which may include other chemical elements in it such as nitrogen, germanium, etc.) can first be formed on exposed surfaces of fin(s) 204 by an oxidation process, and the gate dielectric 304a deposited over the interfacial oxide.

In one exemplary embodiment, gate dielectric 304a is a high-κ dielectric. The term "high-κ," as used herein, refers to a material having a relative dielectric constant κ which is much higher than that of silicon dioxide (e.g., a dielectric constant κ=25 for hafnium oxide (HfO$_2$) rather than 4 for SiO$_2$). Suitable high-κ gate dielectrics include, but are not limited to, hafnium oxide (HfO$_2$) and/or lanthanum oxide (La$_2$O$_3$). Gate dielectric 304a can be conformally deposited into, and lining the gate trenches using a process such as CVD, ALD or PVD. According to an exemplary embodiment, gate dielectric 304a has a thickness of from about 2 nm to about 10 nm and ranges therebetween.

The particular workfunction-setting metal(s) 304b employed can vary depending on whether an n-type or p-type transistor is desired. Suitable n-type workfunction-setting metals include, but are not limited to, titanium nitride (TiN), tantalum nitride (TaN) and/or aluminum (Al)-containing alloys such as titanium aluminide (TiAl), titanium aluminum nitride (TiAlN), titanium aluminum carbide (TiAlC), tantalum aluminide (TaAl), tantalum aluminum nitride (TaAlN), and/or tantalum aluminum carbide (TaAlC). Suitable p-type workfunction-setting metals include, but are not limited to, TiN, TaN and/or tungsten (W). TiN and TaN are relatively thick (e.g., greater than about 2 nm) when used as p-type workfunction metals. However, very thin TiN or TaN layers (e.g., less than about 2 nm) may also be used beneath Al-containing alloys in n-type workfunction stacks to improve electrical properties such as gate leakage currents. Thus, there is some overlap in the exemplary n- and p-type workfunction metals given above. Workfunction-setting metal(s) 304b can be deposited into the gate trenches over the gate dielectric 304a using a process such as ALD.

At this point in the process, the device structure includes source and drains 210, interconnected by fin(s) 204 channel (s), on opposite sides of the gates 304. Gate spacers 208 serve to offset the gates 304 from the source and drains 210.

Figure 4:
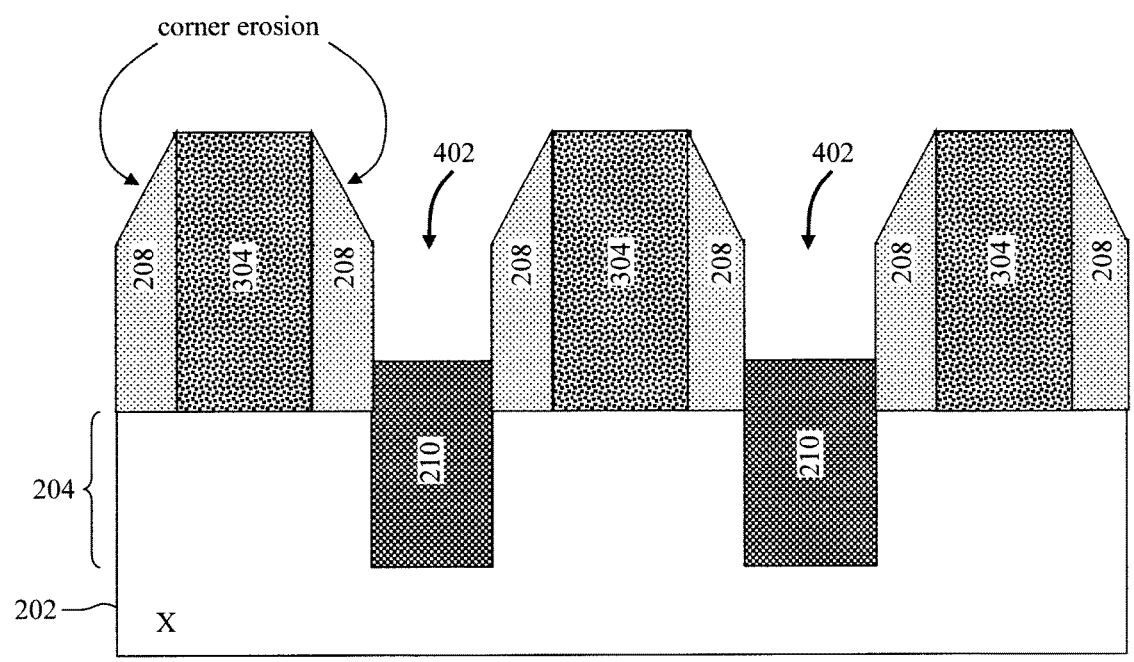
FIG. 4 is a cross-sectional diagram illustrating bottom contact trenches having been patterned in ILD over the source and drains which results in corner erosion of the gate spacers according to an embodiment of the present invention.

Bottom contact trenches 402 are then patterned in ILD 212 over the source and drains 210. See FIG. 4 (a cross-sectional view X). Standard lithography and etching techniques (see above) can be employed to pattern the bottom contact trenches 402. Source and drains 210 are now exposed at the bottoms of the bottom contact trenches 402. As shown in FIG. 4, this patterning of bottom contact trenches 402 results in corner erosion of the gate spacers 208. This is the result of what is referred to herein as a 'non-SAC patterning approach.' To look at it another way, with an SAC patterning approach, SAC caps are typically formed to protect the underlying gates and gate spacers during source and drain contact patterning. However, use of an SAC patterning approach increases production cost, complexity, etc. Notwithstanding, the corner erosion of the spacers 208 will be addressed in the next fabrication step.

Figure 5:
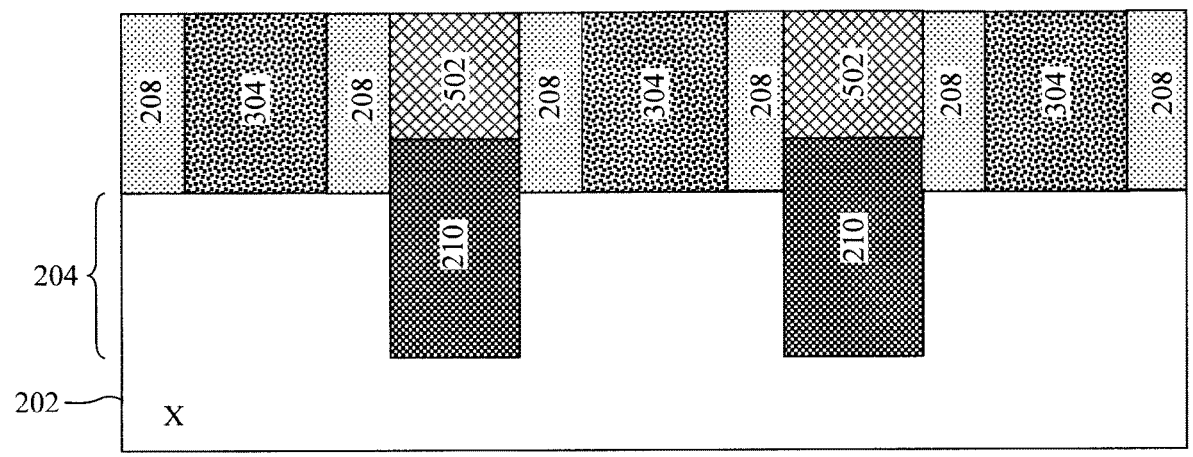
FIG. 5 is a cross-sectional diagram illustrating lower source and drain contacts having been formed in the bottom contact trenches followed by an overpolish to remove the corner erosion of the gate spacers according to an embodiment of the present invention.

Namely, as shown in FIG. 5 (a cross-sectional view X), lower source and drain contacts 502 are next formed in bottom contact trenches 402 followed by an overpolish to remove the corner erosion of the gate spacers 208 from the previous step. According to an exemplary embodiment, lower source and drain contacts 502 are formed by depositing a contact metal or combination of contact metals into the bottom contact trenches 402 using a process such as evaporation, sputtering or electrochemical plating. Suitable contact metals include, but are not limited to, cobalt (Co), ruthenium (Ru) and/or tungsten (W). A process such as CMP with overpolish can be employed to recess the spacers 208, gates 304 and source and drain contacts 502 thereby removing the corner erosion of the spacers 208 and metal overburden. What remains following the overpolish is a coplanar surface across the spacers 208, gates 304 and source and drain contacts 502 as shown in FIG. 5.

Figure 6:
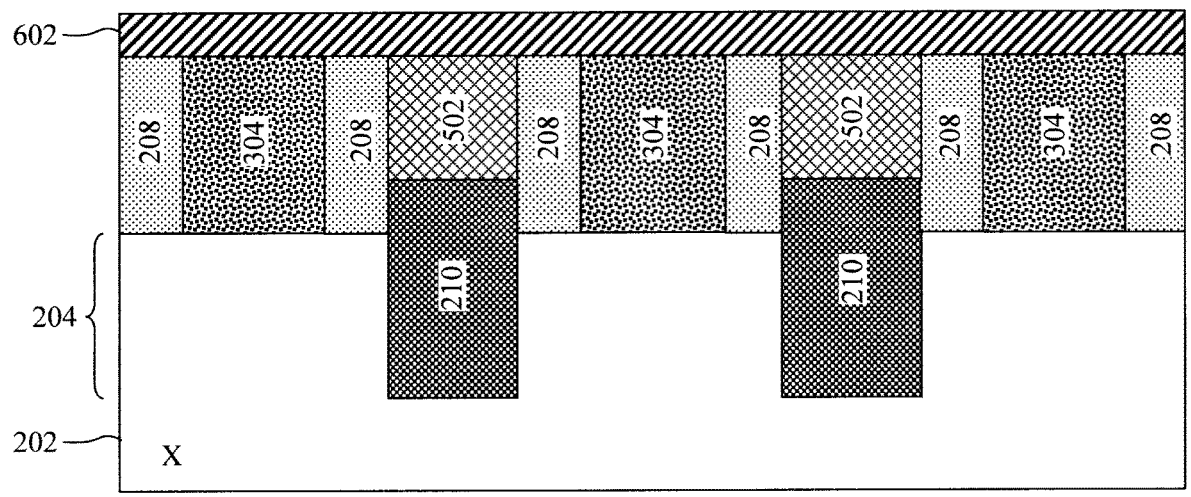
FIG. 6 is a cross-sectional diagram illustrating a silicon (Si) layer having been deposited onto the gate spacers, gates and lower source and drain contacts according to an embodiment of the present invention.

As provided above, in accordance with the present techniques a silicide is formed between the lower source and drain contacts 502 and the upper source and drain contacts (formed below). To do so, an Si layer 602 is next deposited onto the (coplanar) top surfaces of the (recessed) gate spacers 208, gates 304 and lower source and drain contacts 502. See FIG. 6 (a cross-sectional view X). In one exemplary embodiment, Si layer 602 is formed from amorphous Si (a-Si). A process such as CVD, ALD or PVD can be employed to deposit the Si layer 602 onto the recessed gate spacers 208, gates 304 and lower source and drain contacts 502. According to an exemplary embodiment, Si layer 602 has a thickness of from about 5 nanometers (nm) to about 20 nm and ranges therebetween. As shown in FIG. 6, Si layer 602 is in direct contact with the lower source and drain contacts 502. It is by this configuration that the present silicide interlayer in between the lower source and drain contacts 502 and the upper source and drain contacts will be formed. Notably, the silicide will form only in the locations where the Si layer 602 is in contact with the lower source and drain contacts 502. Thus, the silicide (and subsequent upper source and drain contacts) will be self-aligned to the lower source and drain contacts 502, i.e., an SAC process.

Figure 7:
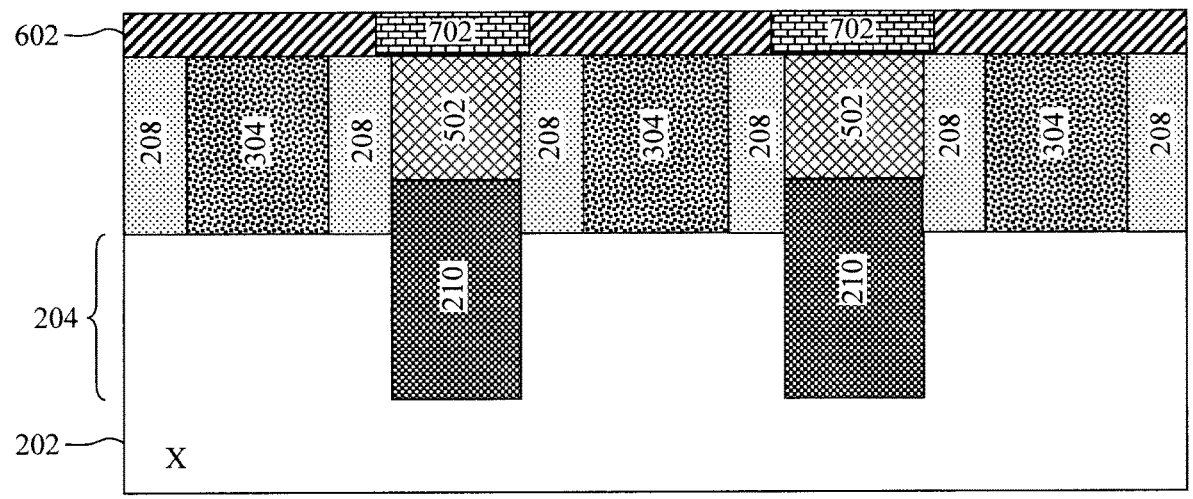
FIG. 7 is a cross-sectional diagram illustrating an anneal of the device structure having been performed under conditions sufficient to react the Si layer with the contact metal(s) in the lower source and drain contacts and form a silicide on the lower source and drain contacts according to an embodiment of the present invention.
Figure 8:
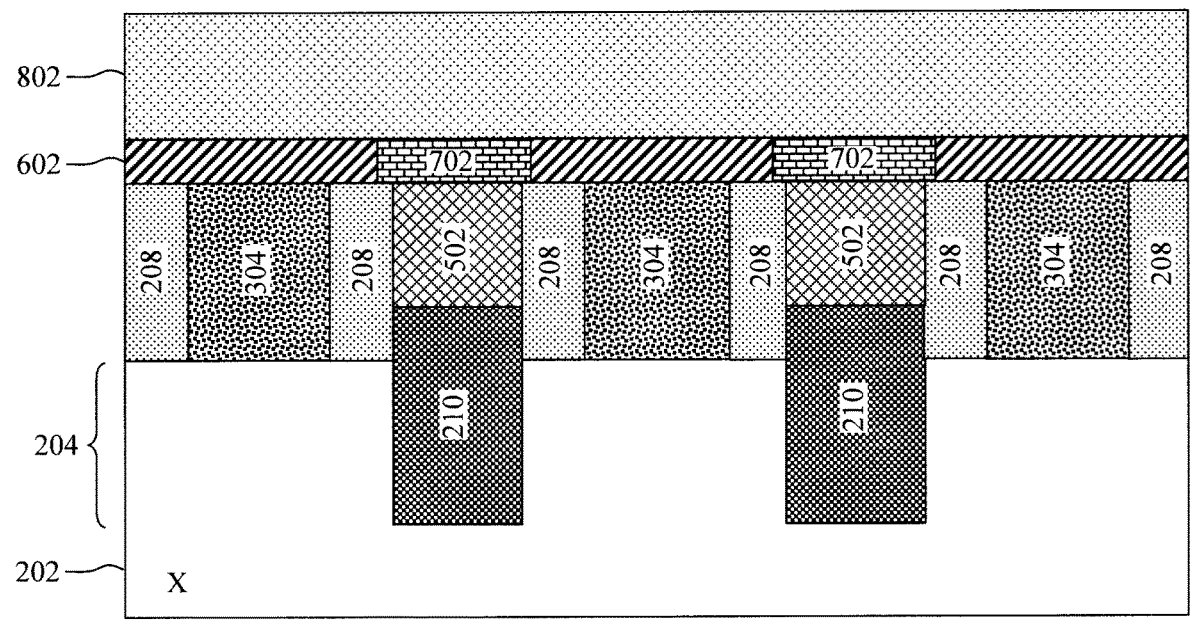
FIG. 8 is a cross-sectional diagram illustrating a (second) ILD having been deposited onto the Si layer over the silicide according to an embodiment of the present invention.

Namely, as shown in FIG. 7 (a cross-sectional view X), an anneal of the device structure is next performed under conditions sufficient to react the Si in layer 602 with the contact metal(s) in lower source and drain contacts 502 and form a silicide 702 on lower source and drain contacts 502. It is notable that the metal of gates 304 is thermally very stable and thus will not react with the Si in layer 602. According to an exemplary embodiment, the conditions include a temperature of less than or equal to about 400° C., e.g., from about 350° C. to about 400° C. and ranges therebetween, and a duration of from about 10 seconds to about 3 hours and ranges therebetween. As shown in FIG. 7, the silicide 702 forms only where the Si layer 602 is in contact with the lower source and drain contacts 502, i.e., silicide 702 is present directly over the lower source and drain contacts 502.

An ILD 802 is then deposited onto Si layer 602 over silicide 702. See FIG. 8 (a cross-sectional view X). ILD 802 may also be referred to herein as a 'second' ILD whereas ILD 212 is the 'first' ILD. As provided above, suitable ILD materials include, but are not limited to, nitride materials such as SiN and/or oxide materials such as SiOx and/or SiCOH and/or ULK-ILD materials such as pSiCOH. A process such as CVD, ALD or PVD can be employed to deposit the ILD 802. Following deposition, ILD 802 can be planarized using a process such as CMP. According to an exemplary embodiment, ILD 802 has a thickness of from about 20 nm to about 60 nm and ranges therebetween. Optionally, the silicide formation annealing (see description of FIG. 7 above) can instead be performed after the deposition of ILD 802.

Figure 9:
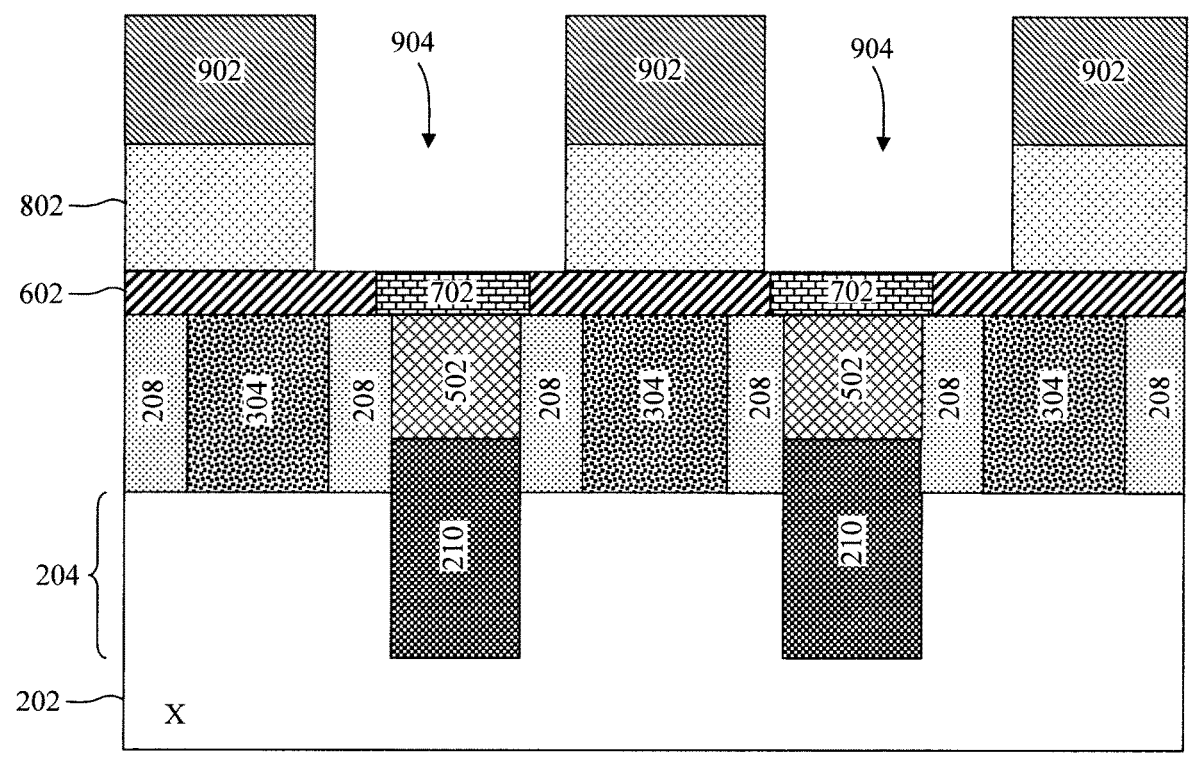
FIG. 9 is a cross-sectional diagram illustrating a block mask having been formed on the second ILD, and the block mask having been used to pattern upper contact trenches in the second ILD 802 according to an embodiment of the present invention.

The next task is to form the upper source and drain contacts. To do so, a block mask 902 is formed on the ILD 802 marking the footprint and location of the upper source and drain contacts over the silicide 702/lower source and drain contacts 502. The block mask 902 is then used to pattern upper contact trenches 904 in the ILD 802. See FIG. 9 (a cross-sectional view X). Suitable block mask 902 materials include, but are not limited to, an organic planarizing layer (OPL) which can be deposited on the ILD 802 using a process such as spin-coating, CVD, ALD or PVD. A directional (anisotropic) etching process such as RIE can be employed to pattern the upper contact trenches 904 in ILD 802. It is notable that the formation of the upper contact trenches 904 in ILD 802 involves a non-SAC etch process. Namely, as shown in FIG. 9, the upper contact trenches 904 each have a size that is wider than the underlying the silicide 702/lower source and drain contacts 502. This is immaterial because, as provided above, silicide 702 is self-aligned with the lower source and drain contacts 502.

Figure 10:
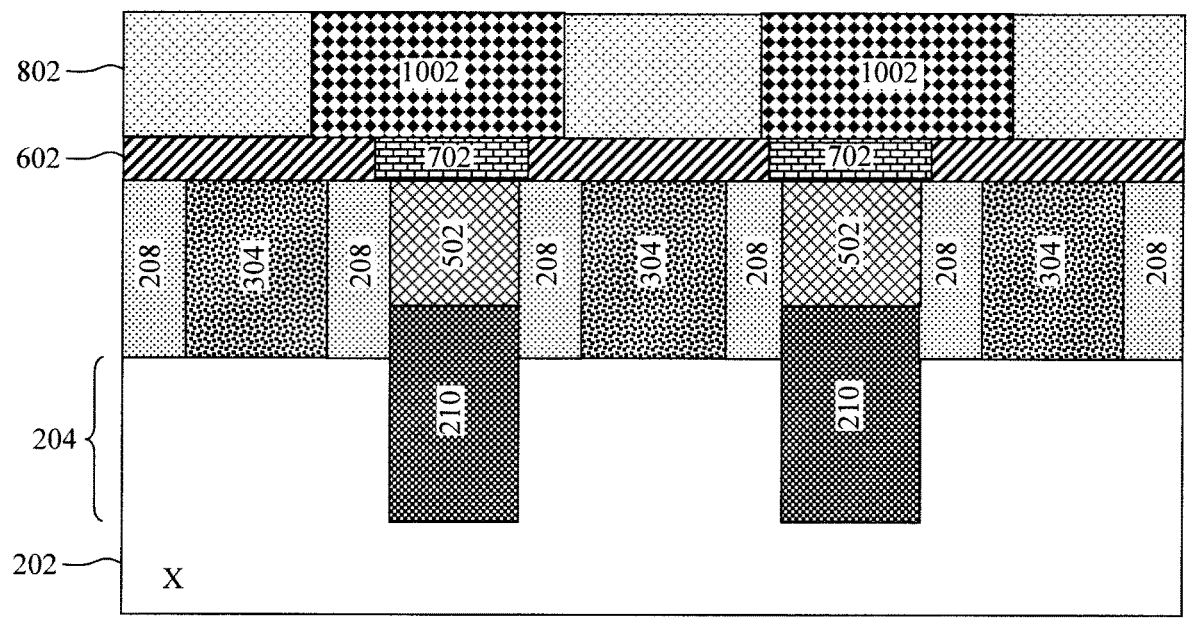
FIG. 10 is a cross-sectional diagram illustrating the block mask having been removed, and upper source and drain contacts having been formed in the upper contact trenches according to an embodiment of the present invention.

The block mask 902 is then removed following patterning of the upper contact trenches 904 in ILD 802. As provided above, the block mask 902 can be formed from an OPL material. In that case, block mask 902 can be removed using a process such as ashing. Upper source and drain contacts 1002 are then formed in the upper contact trenches 904. See FIG. 10 (a cross-sectional view X). To form the upper source and drain contacts 1002, a contact metal or combination of contact metals are deposited into the upper contact trenches 904 using a process such as evaporation, sputtering or electrochemical plating. As provided above, suitable contact metals include, but are not limited to, Co, Ru and/or W. Following deposition, the metal overburden can be removed using a process such as CMP. As shown in FIG. 10, upper source and drain contacts 1002 are in direct contact with the silicide 702.

Figure 11:
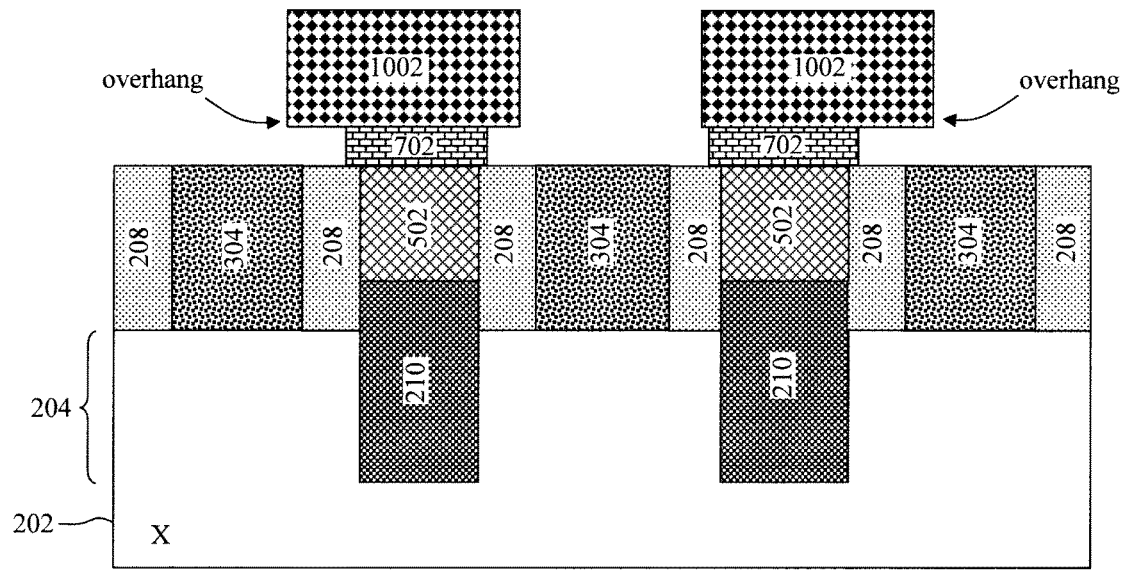
FIG. 11 is a cross-sectional diagram illustrating the second ILD and remaining Si layer having been selectively removed according to an embodiment of the present invention.

The ILD 802 and remaining Si layer 602 are then selectively removed. See FIG. 11 (a cross-sectional view X). Namely, Si layer 602 is a semiconductor so it needs to be removed. ILD 802 is removed to expose the remaining Si layer 602. ILD 802 and Si layer 602 can be removed using a non-directional (isotropic) etching process such as a wet chemical etch. As provided above, the upper contact trenches 904 each have a size that is wider than the underlying silicide 702/lower source and drain contacts 502. As such, following removal of the ILD 802 and Si layer 602 the upper source and drain contacts 1002 will overhang the underlying silicide 702/lower source and drain contacts 502 as shown in FIG. 11.

Figure 12:
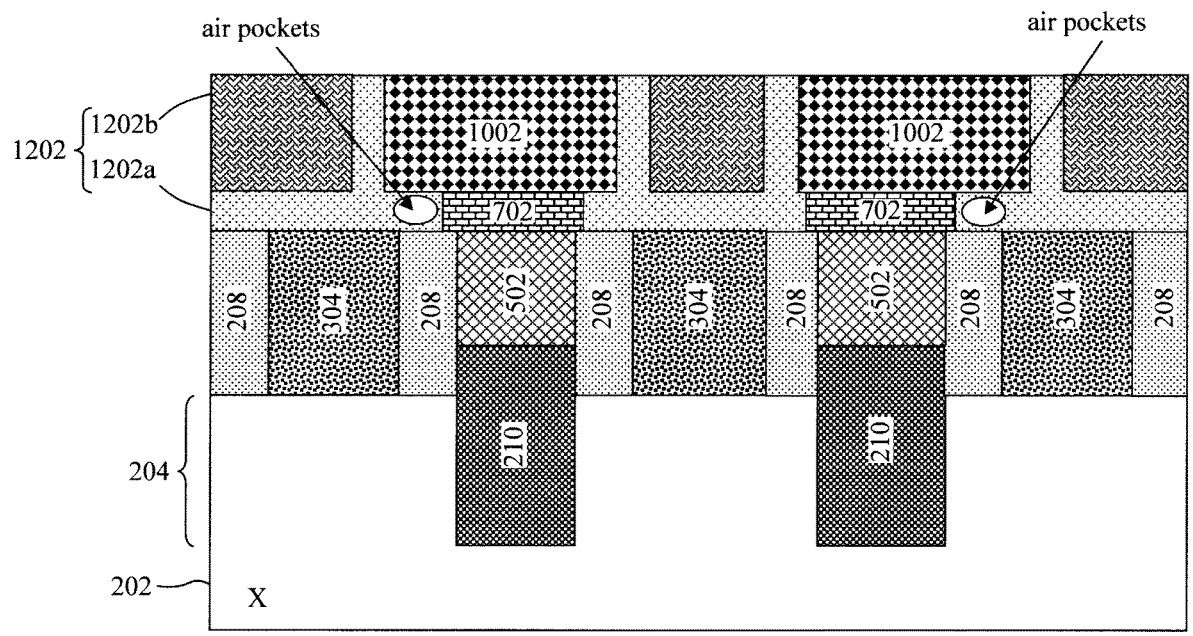
FIG. 12 is a cross-sectional diagram illustrating an ILD stack having been deposited around the upper source and drain contacts, surrounding the upper source and drain contacts according to an embodiment of the present invention.

An ILD stack 1202 is then deposited around the upper source and drain contacts 1002, so as to surround the upper source and drain contacts 1002. See FIG. 12 (a cross-sectional view X). A process such as CVD, ALD or PVD can be employed to deposit the ILD stack 1202. Following deposition, the ILD stack 1202 can be planarized using a process such as CMP. According to an exemplary embodiment, the ILD stack 1202 includes a first ILD layer 1202a deposited on the tops of the gate spacers 208 and gates 304, including below the overhang of the upper source and drain contacts 1002, and along the sidewalls of the upper source and drain contacts 1002. A second ILD layer 1202b is then deposited on the first ILD layer 1202a. In one exemplary embodiment, the first ILD layer 1202a is formed from a nitride material such as SiN, and the second ILD layer 1202b is formed from an oxide material such as SiOx and/or SiCOH and/or an ULK-ILD material such as pSiCOH. As shown in FIG. 12, the overhang of the upper source and drain contacts 1002 can result in a unique structure whereby air pockets can form in the first ILD layer 1202a beneath the upper source and drain contacts 1002. The relative dielectric constant of air is close to 1 which is much smaller than that of $SiO_2$ whose relative dielectric constant is 3.9. Due to the low dielectric constant of the air pockets, the parasitic capacitance of the device can be reduced as a benefit.

With the embodiment just described, the silicide 702 is aligned to the lower source and drain contacts 502. However, there is some overlap of the silicide 702 and the gate spacers 208, and thus a slight chance that shorting can occur between the silicide 702 and the gates 304. Thus, it may be desirable to take steps to confine the silicide to only the area directly over the lower source and drain contacts. See, for example, the alternative embodiment now described by way of reference to FIGS. 13-17. In this alternative process flow, the lower source and drain contacts are recessed prior to depositing the Si layer so as to confine the silicide over the lower source and drain contacts.

Figure 13:
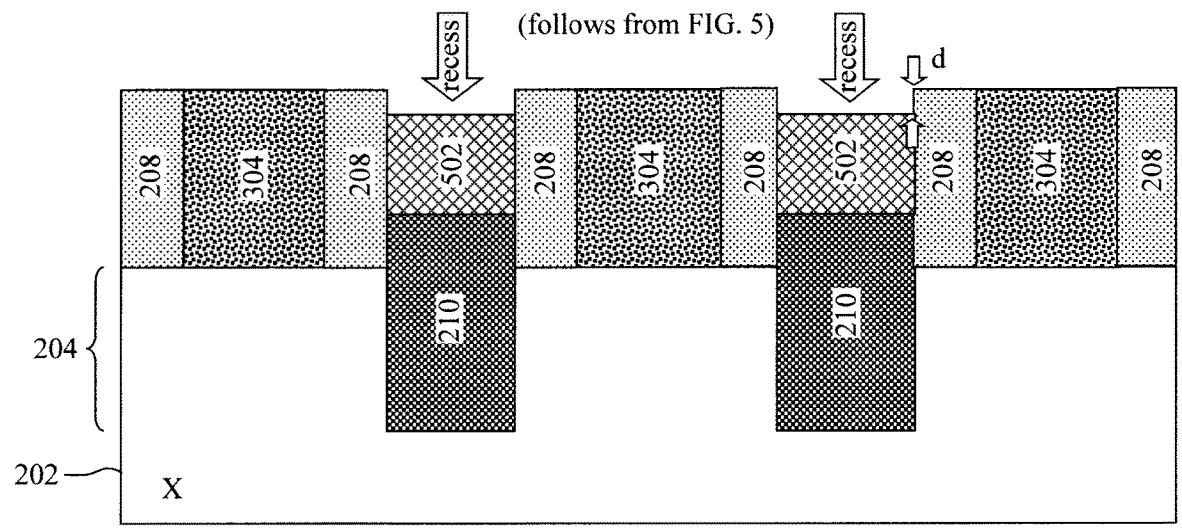
FIG. 13 is a cross-sectional diagram which follows from FIG. 5 illustrating, according to an alternative embodiment, a selective recess etch of the lower source and drain contacts having been performed according to an embodiment of the present invention.

This exemplary embodiment begins in the same manner as described in conjunction with the description of FIGS. 1-5 of the previous example, the description of which is incorporated by reference herein. Accordingly, like structures will be numbered alike in the figures. Thus, what is shown in FIG. 13 follows from the structure depicted in FIG. 5.

However, following the overpolish to remove the corner erosion of the spacers 208, in this example a selective recess etch of the lower source and drain contacts 502 is next performed. See FIG. 13 (a cross-sectional view X). The lower source and drain contacts 502 can be recessed selective to the gate spacers 208 and gates 304. A directional (anisotropic) or nondirectional (isotropic) etching process such as RIE can be employed for the recess etch. According to an exemplary embodiment, a top surface of the lower source and drain contacts 502 is recessed a depth d below the top surfaces of the gate spacers 208 and gates 304 (which are coplanar), wherein d is from about 5 nm to about 10 nm and ranges therebetween.

Figure 14:
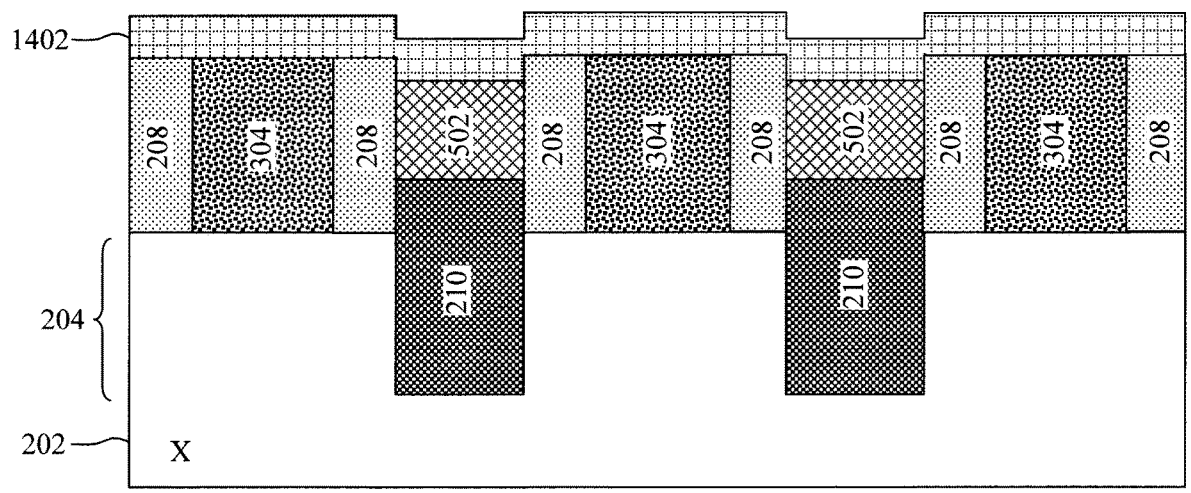
FIG. 14 is a cross-sectional diagram illustrating an Si layer having been deposited onto the top surface of the gate spacers, gates and recessed lower source and drain contacts according to an embodiment of the present invention.
Figure 15:
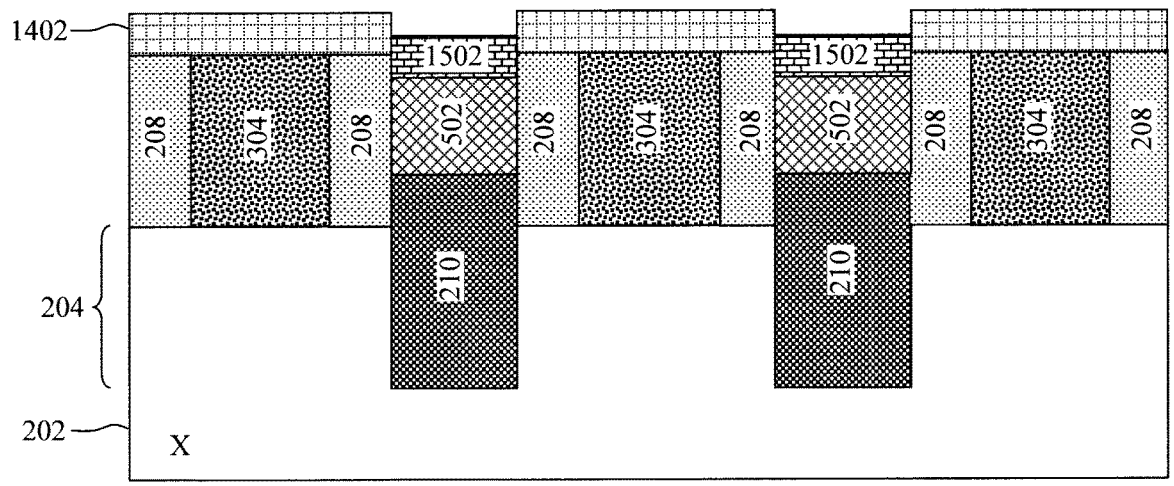
FIG. 15 is a cross-sectional diagram illustrating an anneal having been performed under conditions sufficient to react the Si layer with the contact metal(s) in the lower source and drain contacts and form a silicide on the lower source and drain contacts according to an embodiment of the present invention.

An Si layer 1402 is next deposited onto the top surface of the gate spacers 208, gates 304 and recessed lower source and drain contacts 502. See FIG. 14 (a cross-sectional view X). Like Si layer 602 (see above), Si layer 1402 can be formed from amorphous Si (a-Si). A process such as CVD, ALD or PVD can be employed to deposit the Si layer 1402 onto the gate spacers 208, gates 304 and recessed lower source and drain contacts 502. According to an exemplary embodiment, Si layer 1402 has a thickness of from about 5 nm to about 20 nm and ranges therebetween. As shown in FIG. 14, Si layer 1402 is in direct contact with the (recessed) lower source and drain contacts 502. As described above, it is by this configuration that the present silicide interlayer in between the lower source and drain contacts 502 and the upper source and drain contacts will be formed. Notably, the silicide will form only in the locations where the Si layer 1402 is in contact with the lower source and drain contacts 502. Thus, the silicide (and subsequent upper source and drain contacts) will be self-aligned to the lower source and drain contacts 1402, i.e., an SAC process. As noted above, the metal of gates 304 is thermally very stable and thus will not react with the Si in layer 1402.

In the same manner as described above, an anneal is then performed under conditions sufficient to react the Si in layer 1402 with the contact metal(s) in lower source and drain contacts 502 and form a silicide 1502 on lower source and drain contacts 502. See FIG. 15 (a cross-sectional view X). In this case, however, the prior recess of the lower source and drain contacts 502 serves to confine formation of the silicide 1502 to the space between the gate spacers 208 directly over the lower source and drain contacts 502. Notably, there is no overlap of silicide 1502 over the gate spacers 208, thus eliminating altogether any chance of a short between silicide 1502 and the gates 304. To look at it another way, with this configuration the gate spacers 208 fully separate silicide 1502 from gates 304. According to an exemplary embodiment, the conditions include a temperature of less than or equal to about 400° C., e.g., from about 350° C. to about 400° C. and ranges therebetween, and a duration of from about 10 seconds to about 3 hours and ranges therebetween.

Figure 16:
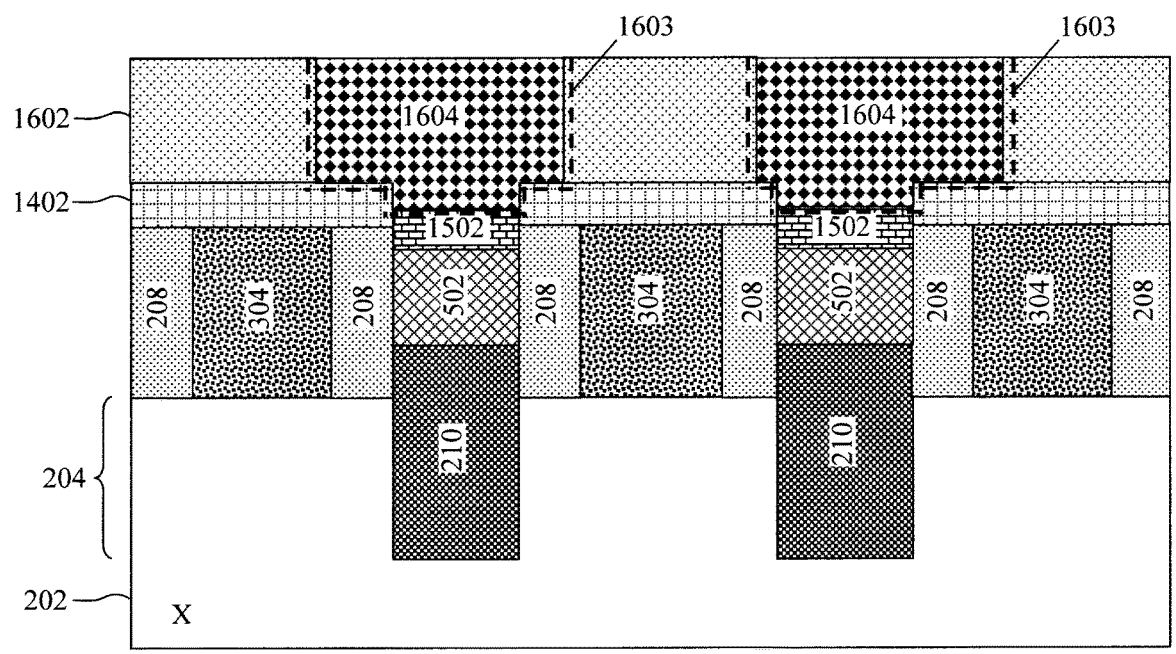
FIG. 16 is a cross-sectional diagram illustrating a (second) ILD having been deposited onto the Si layer over the silicide, upper contact trenches having been patterned in the second ILD, and a contact metal(s) having been deposited into the upper contact trenches to form upper source and drain contacts in direct contact with the silicide according to an embodiment of the present invention.

The remaining steps of the process are performed in the same as in the preceding example. Thus, for brevity, some of the intermediate steps are combined into a single figure. Namely, as shown in FIG. 16 (a cross-sectional view X) a (second, i.e., wherein ILD 212 is the 'first' ILD) ILD 1602 (e.g., SiN, SiOx, SiCOH and/or pSiCOH) is then deposited onto the Si layer 1402 over silicide 1502, upper contact trenches (illustrated with dashed lines 1603) are patterned in the ILD 1602, and a contact metal(s) such as Co, Ru and/or W is then deposited into the upper contact trenches, followed by CMP, to form upper source and drain contacts 1604 in direct contact with the silicide 1502. As provided above, the silicide formation annealing (see description of FIG. 15 above) can instead be performed after the deposition of the ILD 1602. Although not specifically shown in FIG. 16, a block mask is used for patterning the upper contact trenches in the ILD 1602 in the same manner as described in conjunction with the description of FIG. 9 above, the description of which is incorporated by reference herein.

In the same manner as described above, following formation of the upper source and drain contacts 1604 the ILD 1602 and remaining Si layer 1402 are selectively removed, e.g., using a non-directional (isotropic) etching process such as a wet chemical etch. Following removal of the ILD 1602 and Si layer 1402 the upper source and drain contacts 1602 overhang the underlying the silicide 1502/lower source and drain contacts 502.

Figure 17:
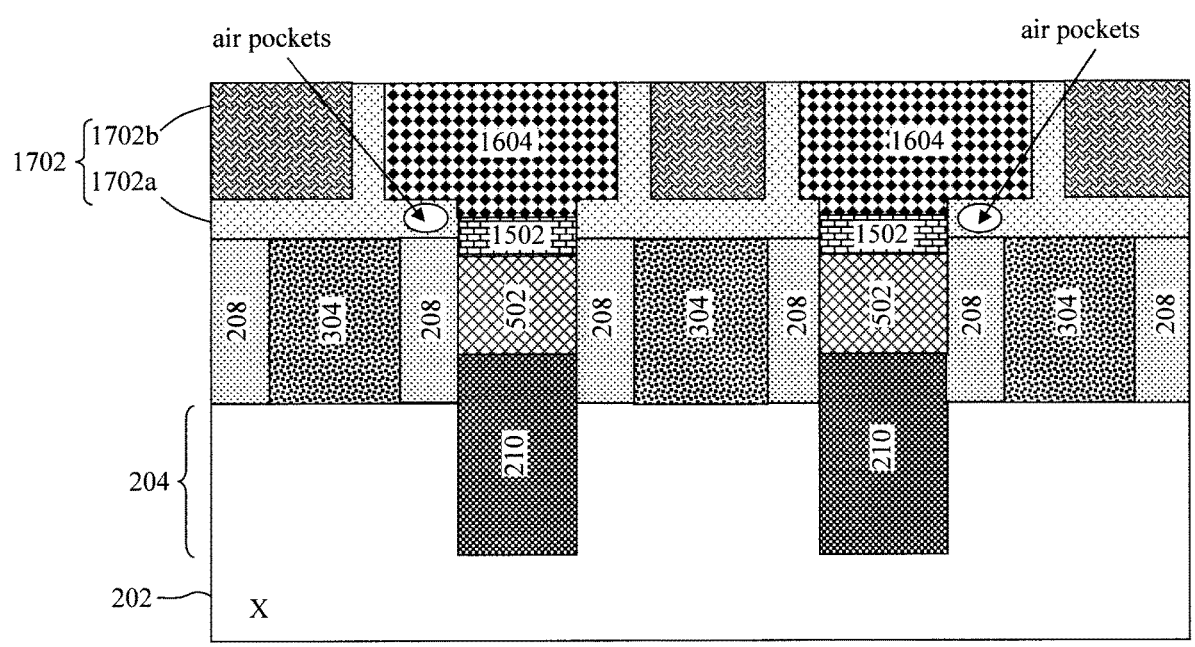
FIG. 17 is a cross-sectional diagram illustrating the second ILD and remaining Si layer having been selectively removed, and an ILD stack having been deposited around the upper source and drain contacts surrounding the upper source and drain contacts according to an embodiment of the present invention.

An ILD stack 1702 is then deposited around the upper source and drain contacts 1602, so as to surround the upper source and drain contacts 1602. See FIG. 17 (a cross-sectional view X). A process such as CVD, ALD or PVD can be employed to deposit the ILD stack 1702. Following deposition, the ILD stack 1702 can be planarized using a process such as CMP. According to an exemplary embodiment, the ILD stack 1702 includes a first ILD layer 1702a deposited on the tops of the gate spacers 208 and gates 304, including below the overhang of the upper source and drain contacts 1604, and along the sidewalls of the upper source and drain contacts 1604. A second ILD layer 1702b is then deposited on the first ILD layer 1702a. In one exemplary embodiment, the first ILD layer 1702a is formed from a nitride material such as SiN, and the second ILD layer 1702b is formed from an oxide material such as SiOx and/or SiCOH and/or an ULK-ILD material such as pSiCOH. As shown in FIG. 17, the overhang of the upper source and drain contacts 1604 can result in a unique structure whereby air pockets can form in the first ILD layer 1702a beneath the upper source and drain contacts 1604. As provided above, the relative dielectric constant of air is close to 1 which is much smaller than that of $SiO_2$ whose relative dielectric constant is 3.9. Due to the low dielectric constant of the air pockets, the parasitic capacitance of the device can be reduced as a benefit.

In a variant of the embodiment just described in FIGS. 13-17, additional steps can be performed to lower the contact resistance between the upper and lower source and drain contacts by employing a low resistance silicide on the lower source and drain contact. See, for example, methodology 1800 of FIG. 18.

This exemplary embodiment begins in the same manner as described in conjunction with the description of FIGS. 1-5 of the example above, the description of which is incorporated by reference herein. Accordingly, like structures will be numbered alike in the figures. Thus, what is shown in step 1802 of methodology 1800 follows from the structure depicted in FIG. 5.

However, following the overpolish to remove the corner erosion of the spacers 208, in this example a selective recess etch of the lower source and drain contacts 502 is next performed. See step 1802 (a cross-sectional view X). The lower source and drain contacts 502 can be recessed selective to the gate spacers 208 and gates 304. A directional (anisotropic) or nondirectional (isotropic) etching process such as RIE can be employed for the recess etch. According to an exemplary embodiment, a top surface of the lower source and drain contacts 502 is recessed a depth d' below the top surfaces of the gate spacers 208 and gates 304 (which are coplanar), wherein d' is from about 5 nm to about 10 nm and ranges therebetween.

A metal layer 1820 is then deposited onto the recessed lower source and drain contacts 502. See step 1804 (a cross-sectional view X). Metal layer 1820 can be deposited using a process such as evaporation, sputtering or electrochemical plating. Following deposition, the metal can be planarized using a process such as CMP. The result is that metal layer 1802 is now present only in the recess between the gate spacers 208, directly over the lower source and drain contacts 502. Metal layer 1820 includes a contact metal or combination of metals that will be used to form a low resistance silicide. For instance, in one exemplary embodiment, metal layer 1820 is formed from nickel (Ni). Nickel silicide (NiSi) has a lower resistivity (i.e., from about 14 microohm centimeter (μΩcm) to about 20 μΩcm and ranges therebetween) for instance as compared to cobalt silicide (CoSi) (which has a resistivity of from about 100 μΩcm to about 150 μΩcm and ranges therebetween).

Figure 18:
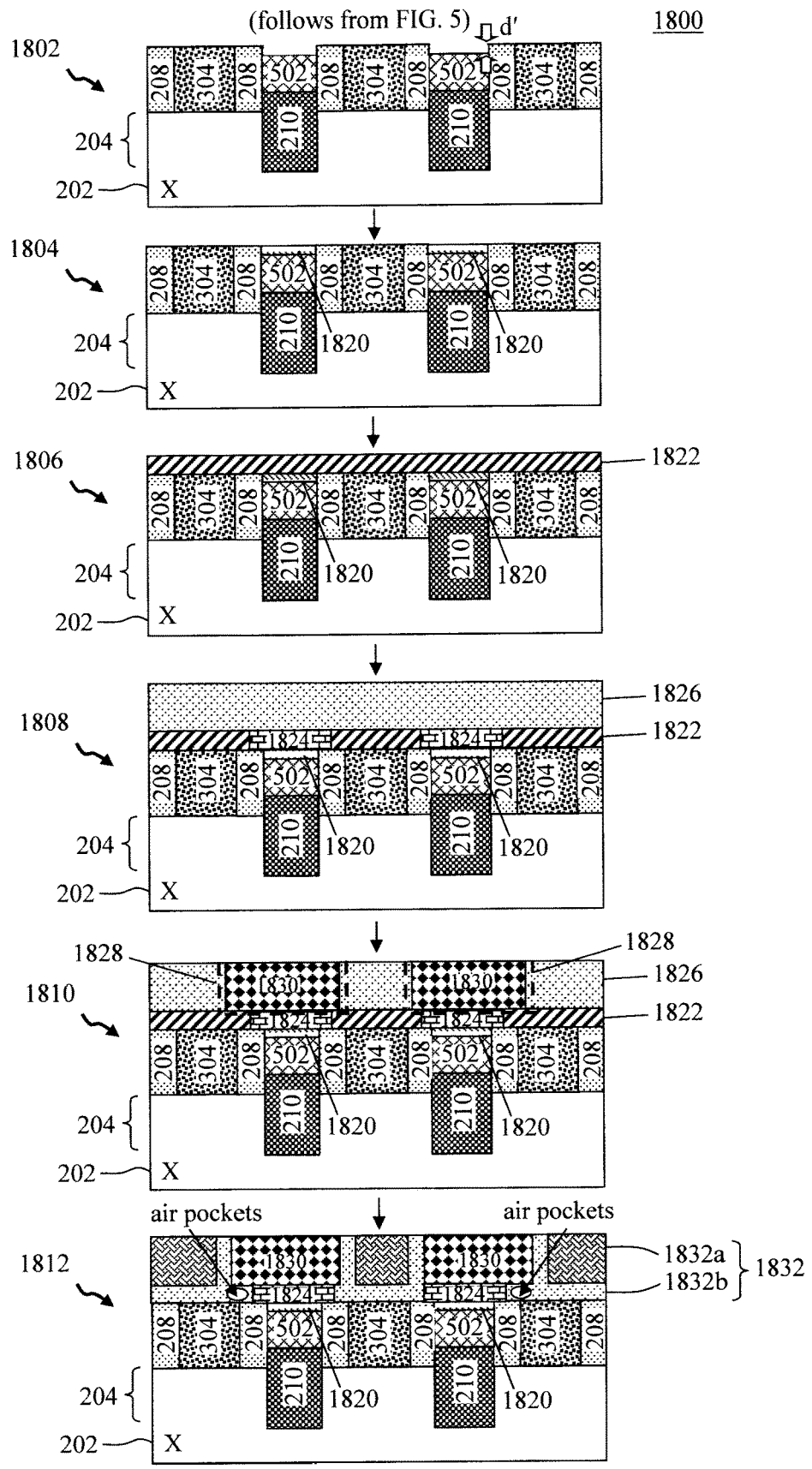
FIG. 18 is a cross-sectional diagram which follows from FIG. 5 illustrating, according to another alternative embodiment, an exemplary methodology for forming a semiconductor FET device where a low resistance silicide is formed on the lower source and drain contact according to an embodiment of the present invention.

An Si layer 1822 is next deposited onto the top surface of the gate spacers 208, gates 304 and metal layer 1820. See step 1806 (a cross-sectional view X). Like Si layers 602 and 1402 (see above), Si layer 1822 can be formed from amorphous Si (a-Si). A process such as CVD, ALD or PVD can be employed to deposit the Si layer 1822 onto the gate spacers 208, gates 304 and metal layer 1820. According to an exemplary embodiment, Si layer 1822 has a thickness of from about 5 nm to about 20 nm and ranges therebetween. As shown in FIG. 18, Si layer 1822 is in direct contact with the metal layer 1820. As described above, it is by this configuration that the present silicide interlayer in between the lower source and drain contacts 502 and the upper source and drain contacts will be formed. Notably, the silicide will form only in the locations where the Si layer 1822 is in contact with the metal layer 1820 over the lower source and drain contacts 502. Thus, the silicide (and subsequent upper source and drain contacts) will be self-aligned to the metal layer 1820/lower source and drain contacts 502, i.e., an SAC process. As noted above, the metal of gates 304 is thermally very stable and thus will not react with the Si in layer 1822.

In the same manner as described above, an anneal is then performed under conditions sufficient to react the Si in layer 1822 with the metal(s) in layer 1820 and form a silicide 1824 on lower source and drain contacts 502. See step 1808 (a cross-sectional view X). To use an illustrative, non-limiting example, when metal layer 1820 is nickel (Ni), then the silicide 1824 formed is nickel silicide (NiSi). According to an exemplary embodiment, the conditions include a temperature of less than or equal to about 400° C., e.g., from about 350° C. to about 400° C. and ranges therebetween, and a duration of from about 10 seconds to about 3 hours and ranges therebetween.

The remaining steps of the process are performed in the same as in the preceding examples. Thus, for brevity, some of the intermediate steps are combined into a single figure. Namely, as shown in step 1810 (a cross-sectional view X) a (second, i.e., wherein ILD 212 is the 'first' ILD) ILD 1826 (e.g., SiN, SiOx, SiCOH and/or pSiCOH) is then deposited onto the Si layer 1822 over silicide 1824, upper contact trenches (illustrated with dashed lines 1828) are patterned in the ILD 1826, and a contact metal(s) such as Co, Ru and/or W is then deposited into the upper contact trenches, followed by CMP, to form upper source and drain contacts 1830 in direct contact with the silicide 1824. As provided above, the silicide formation annealing (see description of step 1808 above) can instead be performed after the deposition of the ILD 1826. Although not specifically shown in step 1810, a block mask is used for patterning the upper contact trenches in the ILD 1826 in the same manner as described in conjunction with the description of FIG. 9 above, which is incorporated by reference herein.

In the same manner as described above, following formation of the upper source and drain contacts 1830 the ILD 1826 and remaining Si layer 1822 are selectively removed, e.g., using a non-directional (isotropic) etching process such as a wet chemical etch. Following removal of the ILD 1826 and Si layer 1822 the upper source and drain contacts 1830 overhang the underlying the silicide 1824/lower source and drain contacts 502.

An ILD stack 1832 is then deposited around the upper source and drain contacts 1830, so as to surround the upper source and drain contacts 1830. See step 1812 (a cross-sectional view X). A process such as CVD, ALD or PVD can be employed to deposit the ILD stack 1832. Following deposition, the ILD stack 1832 can be planarized using a process such as CMP. According to an exemplary embodiment, the ILD stack 1832 includes a first ILD layer 1832a deposited on the tops of the gate spacers 208 and gates 304, including below the overhang of the upper source and drain contacts 1830, and along the sidewalls of the upper source and drain contacts 1830. A second ILD layer 1832*b* is then deposited on the first ILD layer 1832*a*. In one exemplary embodiment, the first ILD layer 1832*a* is formed from a nitride material such as SiN, and the second ILD layer 1832*b* is formed from an oxide material such as SiOx and/or SiCOH and/or an ULK-ILD material such as pSiCOH. As shown in step 1812, the overhang of the upper source and drain contacts 1830 can result in a unique structure whereby air pockets can form in the first ILD layer 1832*a* beneath the upper source and drain contacts 1830. As provided above, the relative dielectric constant of air is close to 1 which is much smaller than that of $SiO_2$ whose relative dielectric constant is 3.9. Due to the low dielectric constant of the air pockets, the parasitic capacitance of the device can be reduced as a benefit.

Other variants of the above-described processes are also contemplated herein. For instance, to further reduce the contact resistance the above processes can be performed in the same manner as described except that a sacrificial material is used as a placeholder for the upper source and drain contacts. Following deposition of the ILD stack, the sacrificial material and the silicide can then be removed and replaced with a contact metal(s) to form the final upper source and drain contacts. See, for example, methodology 1900 of FIG. 19.

This exemplary embodiment begins in the same manner as described in conjunction with the description of FIGS. 1-5 of the example above, the description of which is incorporated by reference herein. Accordingly, like structures will be numbered alike in the figures. Thus, what is shown in step 1902 of methodology 1900 follows from the structure depicted in FIG. 5.

However, following the overpolish to remove the corner erosion of the spacers 208, in this example a selective recess etch of the lower source and drain contacts 502 is next performed. See step 1902 (a cross-sectional view X). The lower source and drain contacts 502 can be recessed selective to the gate spacers 208 and gates 304. A directional (anisotropic) or nondirectional (isotropic) etching process such as RIE can be employed for the recess etch. According to an exemplary embodiment, a top surface of the lower source and drain contacts 502 is recessed a depth d" below the top surfaces of the gate spacers 208 and gates 304 (which are coplanar), wherein d' is from about 5 nm to about 10 nm and ranges therebetween. It is notable that methodology 1900 can be implemented in accordance with any of the process flows described herein, including one where a recess etch of the lower source and drain contacts 502 is not performed (see, e.g., FIGS. 1-12, described above).

Figure 19:
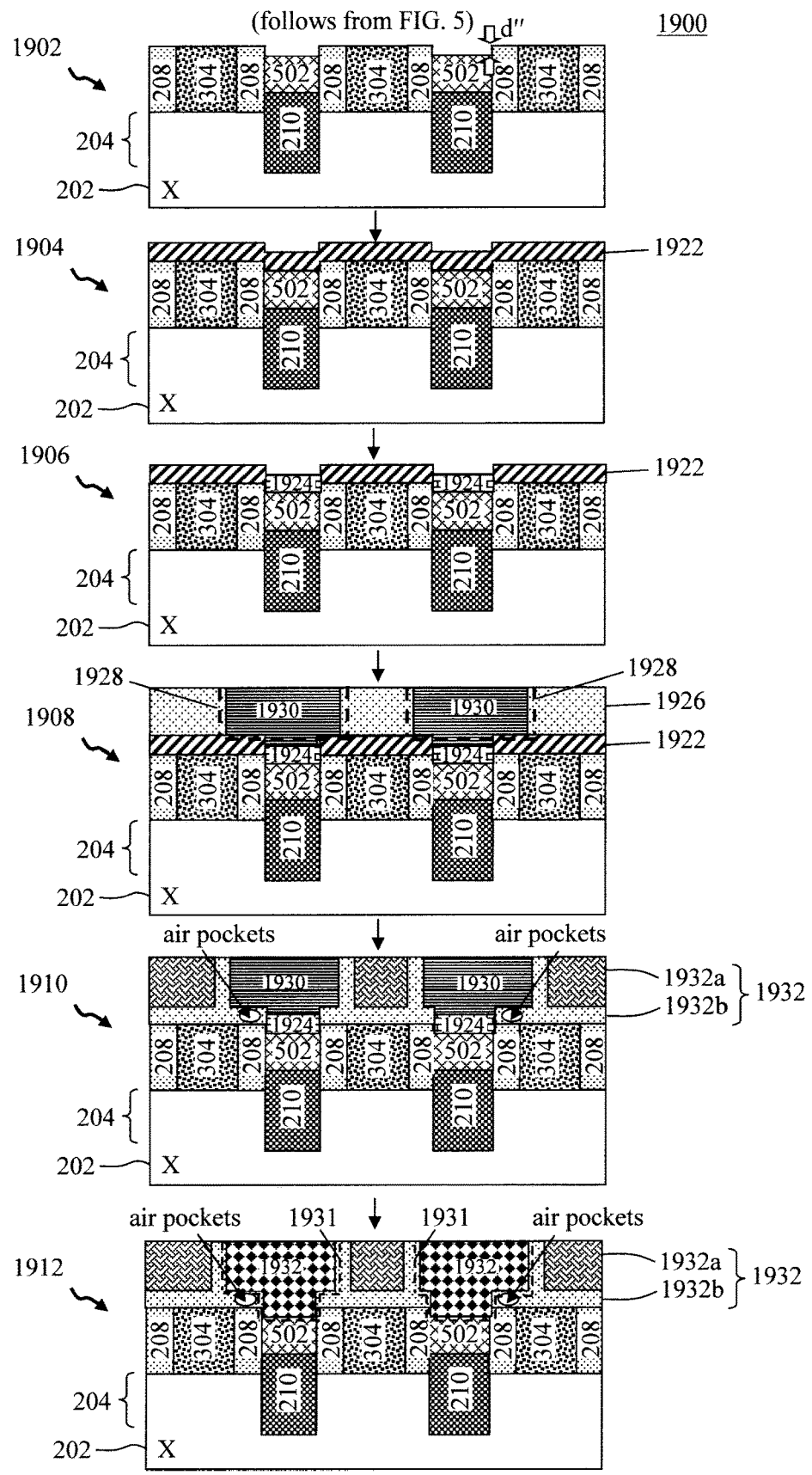
FIG. 19 is a cross-sectional diagram which follows from FIG. 5 illustrating, according to yet another alternative embodiment, an exemplary methodology for forming a semiconductor FET device where a sacrificial upper source and drain contact is used during silicide formation, which is then removed along with the silicide and replaced with an upper source and drain contact that is in direct contact with the lower source and drain contact according to an embodiment of the present invention.

An Si layer 1922 is next deposited onto the top surface of the gate spacers 208, gates 304 and (recessed) lower source and drain contacts 502. See step 1904 (a cross-sectional view X). Like Si layers 602, 1402 and 1822 (see above), Si layer 1922 can be formed from amorphous Si (a-Si). A process such as CVD, ALD or PVD can be employed to deposit the Si layer 1922 onto the gate spacers 208, gates 304 and lower source and drain contacts 502. According to an exemplary embodiment, Si layer 1922 has a thickness of from about 5 nm to about 20 nm and ranges therebetween. As shown in FIG. 19, Si layer 1922 is in direct contact with the lower source and drain contacts 502. As described above, it is by this configuration that the present silicide interlayer between the lower source and drain contacts 502 and the upper source and drain contacts will be formed. Notably, the silicide will form only in the locations where the Si layer 1922 is in contact with the lower source and drain contacts 502. Thus, the silicide (and subsequent upper source and drain contacts) will be self-aligned to the lower source and drain contacts 502, i.e., an SAC process. As noted above, the metal of gates 304 is thermally very stable and thus will not react with the Si in layer 1922.

In the same manner as described above, an anneal is then performed under conditions sufficient to react the Si in layer 1922 with the contact metal(s) in the lower source and drain contacts 502 and form a silicide 1924 on the lower source and drain contacts 502. See step 1906 (a cross-sectional view X). According to an exemplary embodiment, the conditions include a temperature of less than or equal to about 400° C., e.g., from about 350° C. to about 400° C. and ranges therebetween, and a duration of from about 10 seconds to about 3 hours and ranges therebetween.

The remaining steps of the process are performed in a similar manner as in the preceding examples. Thus, for brevity, some of the intermediate steps that have already been described are combined into a single figure. Namely, as shown in step 1908 (a cross-sectional view X) a (second, i.e., wherein ILD 212 is the 'first' ILD) ILD 1926 (e.g., SiN, SiOx, SiCOH and/or pSiCOH) is then deposited onto the Si layer 1922 over silicide 1924, and upper contact trenches (illustrated with dashed lines 1928) are patterned in the ILD 1926. However, in this example, sacrificial upper source and drain contacts 1930 are then formed in the upper contact trenches. Sacrificial upper source and drain contacts 1930 are formed by depositing a suitable sacrificial material into the upper contact trenches (e.g., using a process such as CVD, ALD or PVD) followed by planarization using a process such as CMP. Suitable sacrificial materials include, but are not limited to, tungsten (W). As provided above, the silicide formation annealing (see description of step 1906 above) can instead be performed after the deposition of the ILD 1926. Although not specifically shown in step 1908, a block mask is used for patterning the upper contact trenches in the ILD 1926 in the same manner as described in conjunction with the description of FIG. 9 above, which is incorporated by reference herein.

The ILD 1926 and remaining Si layer 1922 are then selectively removed, e.g., using a non-directional (isotropic) etching process such as a wet chemical etch. Following removal of the ILD 1926 and Si layer 1922 the sacrificial upper source and drain contacts 1930 overhang the underlying the silicide 1924/lower source and drain contacts 502.

An ILD stack 1932 is then deposited around the sacrificial upper source and drain contacts 1930, so as to surround the sacrificial upper source and drain contacts 1930. See step 1910 (a cross-sectional view X). A process such as CVD, ALD or PVD can be employed to deposit the ILD stack 1932. Following deposition, the ILD stack 1932 can be planarized using a process such as CMP. According to an exemplary embodiment, the ILD stack 1932 includes a first ILD layer 1932*a* deposited on the tops of the gate spacers 208 and gates 304, including below the overhang of the sacrificial upper source and drain contacts 1930, and along the sidewalls the sacrificial upper source and drain contacts 1930. A second ILD layer 1932*b* is then deposited on the first ILD layer 1932*a*. In one exemplary embodiment, the first ILD layer 1932*a* is formed from a nitride material such as SiN, and the second ILD layer 1932*b* is formed from an oxide material such as SiOx and/or SiCOH and/or an ULK-ILD material such as pSiCOH. As shown in step 1910, the overhang of the sacrificial upper source and drain contacts 1930 can result in a unique structure whereby air pockets can form in the first ILD layer 1932*a* beneath the upper source and drain contacts 1930. As provided above, the relative dielectric constant of air is close to 1 which is much smaller than that of $SiO_2$ whose relative dielectric constant is 3.9. Due to the low dielectric constant of the air pockets, the parasitic capacitance of the device can be reduced as a benefit.

The sacrificial upper source and drain contacts 1930 and underlying silicide 1924 are then removed and replaced with upper source and drain contacts 1932. The sacrificial upper source and drain contacts 1930 and silicide 1924 can be removed using a selective etching process. For instance, sacrificial upper source and drain contacts 1930 can be chemically removed using am SC1 etch, and silicide 1924 can be removed using an SPM etch. Removal of the sacrificial upper source and drain contacts 1930 and silicide 1924 forms cavities (illustrated using dashed lines 1931) over the lower source and drain contacts 502. A contact metal(s) such as Co, Ru and/or W is then deposited into the cavities, followed by CMP, to form upper source and drain contacts 1932 in direct contact with the lower source and drain contacts 502. Thereby, any of the resistivity introduced by the intervening silicide (as in the previous examples) is eliminated.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A semiconductor field-effect transistor (FET) device, comprising:
    at least one gate disposed on a substrate;
    source and drains on opposite sides of the at least one gate; gate spacers offsetting the at least one gate from the source and drains; lower source and drain contacts disposed on the source and drains;
    upper source and drain contacts disposed on the lower source and drain contacts; and a silicide present between the lower source and drain contacts and the upper source and drain contacts, wherein the upper source and drain contacts overhang the silicide such that a top of the silicide directly contacts only a portion of a bottom-most surface of the upper source and drain contacts,
    wherein the FET device further comprises aft pockets present the first ILD layer directly beneath portions of the upper source and drain contacts that overhang the silicide.

2. The semiconductor FET device of claim 1, wherein a top surface of the lower source and drain contacts is recessed a depth d below top surfaces of the gates and the gate spacers.

3. The semiconductor FET device of claim 2, wherein d is from about 5 nm to about 10 nm and ranges therebetween.

4. The semiconductor FET device of claim 2, wherein the silicide is present in a space between the gate spacers directly over the lower source and drain contacts.

5. The semiconductor FET device of claim 2, further comprising:
    a metal layer disposed on the lower source and drain contacts.

6. The semiconductor FET device of claim 5, wherein the metal layer comprises nickel (Ni), and wherein the silicide comprises nickel silicide (NiSi).

7. The semiconductor FET device of claim 1, further comprising:
    an interlayer dielectric (ILD) stack surrounding the upper source and drain contacts.

8. The semiconductor FET device of claim 7, wherein the ILD stack comprises:
    a first ILD layer disposed on top of the gates and the gate spacers, and along sidewalls of the upper source and drain contacts; and
    a second ILD layer disposed on the first ILD layer.

9. The semiconductor FET device of claim 8, wherein the first ILD layer comprises a nitride material, and wherein the second ILD layer comprises an oxide material.

10. The semiconductor FET device of claim 8, further comprising:
    air pockets present in the first ILD layer directly beneath portions of the upper source and drain contacts that overhang the silicide.

11. A method of forming a semiconductor FET device, the method comprising;
    "forming a device structure comprising at least one gate, source and drains on opposite sides of the at least one gate, and
    gate spacers offsetting the at least one gate from the source and drains;
    forming lower source and drain contacts on the source and drains;
    depositing a silicon (Si) layer over the gates, the gate spacers, and the lower source and drain contacts;
    annealing the device structure under conditions sufficient to form a silicide directly on the lower source and drain contacts; and
    forming upper source and drain contacts in direct contact with the silicide,
    wherein the upper source and drain contacts overhang the silicide such that a top of the silicide directly contacts only a portion of a bottom-most surface of the upper source and drain contacts,
    wherein the FET device further comprises air pockets present in the first ILD layer directly beneath portions of the upper source and drain contacts that overhang the silicide.

12. The method of claim 11, wherein the Si layer comprises amorphous silicon.

13. The method of claim 11, wherein the conditions comprise a temperature of from about 350° C. to about 400° C. and ranges therebetween, and a duration of from about 10 seconds to about 3 hours and ranges therebetween.

14. The method of claim 11, further comprising:
    depositing an ILD on the Si layer over the silicide;
    patterning upper contact trenches in the ILD over the silicide; and
    forming the upper source and drain contacts in the upper contact trenches.

15. The method of claim 14, further comprising:
    removing the ILD and the Si layer; and
    depositing an ILD stack comprising a first ILD layer and a second ILD layer surrounding the upper source and drain contacts.

16. The method of claim 15, further comprising:
    depositing the first ILD layer on top of the gates and the gate spacers, and along sidewalls of the upper source and drain contacts; and
    depositing the second ILD layer on the first ILD layer.

17. The method of claim 11, further comprising:
    recessing the lower source and drain contacts such that a top surface of the lower source and drain contacts is recessed a depth d below top surfaces of the gates and the gate spacers, wherein d is from about 5 nm to about 10 nm and ranges therebetween.

18. The method of claim 17, further comprising:
depositing a metal layer on the lower source and drain contacts.

19. The method of claim 18, wherein the metal layer comprises nickel (Ni), and wherein the silicide comprises nickel silicide (NiSi).

20. A method of forming a semiconductor FET device, the method comprising:
- forming a device structure comprising at least one gate, source and drains on opposite sides of the at least one gate, and gate spacers offsetting the at least one gate from the source and drains;
- forming lower source and drain contacts on the source and drains;
- depositing a silicon (Si) layer over the gates, the gate spacers, and the lower source and drain contacts;
- annealing the device structure under conditions sufficient to form a silicide directly on the lower source and drain contacts;
- depositing an ILD on the Si layer over the silicide;
- patterning upper contact trenches in the ILD over the silicide;
- forming sacrificial upper source and drain contacts in the upper contact trenches;
- removing the ILD and the Si layer;
- depositing an ILD stack comprising a first ILD layer and a second ILD layer surrounding the sacrificial upper source and drain contacts;
- removing the sacrificial upper source and drain contacts and the silicide to form cavities over the lower source and drain contacts; and
- forming upper source and drain contacts in the cavities, wherein the upper source and drain contacts overhang the silicide such that a top of the silicide directly contacts only a portion of a bottom-most surface of the upper source and drain contacts.

* * * * *